US012057444B2

(12) United States Patent
Mitra et al.

(10) Patent No.: US 12,057,444 B2
(45) Date of Patent: Aug. 6, 2024

(54) OPERATING VOLTAGE-TRIGGERED SEMICONDUCTOR CONTROLLED RECTIFIER

(71) Applicant: GlobalFoundries U.S. Inc., Malta, NY (US)

(72) Inventors: Souvick Mitra, Essex Junction, VT (US); Alain F. Loiseau, Williston, VT (US); Robert J. Gauthier, Jr., Williston, VT (US); Meng Miao, Williston, VT (US); Anindya Nath, Essex Junction, VT (US); Wei Liang, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 243 days.

(21) Appl. No.: 17/808,364

(22) Filed: Jun. 23, 2022

(65) Prior Publication Data
US 2023/0420448 A1    Dec. 28, 2023

(51) Int. Cl.
*H01L 27/02* (2006.01)
*H01L 29/74* (2006.01)

(52) U.S. Cl.
CPC ...... *H01L 27/0262* (2013.01); *H01L 29/7436* (2013.01)

(58) Field of Classification Search
CPC ............. H01L 27/0259; H01L 27/0262; H01L 29/7436; H01L 27/0266; H01L 27/0288; H01L 27/0296
See application file for complete search history.

(56) References Cited

U.S. PATENT DOCUMENTS

| 6,674,622 | B1 | 1/2004 | Yu et al. |
| 7,274,047 | B2 | 9/2007 | Russ et al. |
| 8,134,211 | B2 | 3/2012 | Manna et al. |
| 8,373,956 | B2 | 2/2013 | Abou-Khalil et al. |
| 9,607,978 | B2 | 3/2017 | Deval et al. |
| 10,763,250 | B2 | 9/2020 | Gao et al. |
| 11,201,215 | B2 | 12/2021 | Han et al. |

(Continued)

FOREIGN PATENT DOCUMENTS

| TW | 201444051 A | 11/2014 |
| TW | 201703157 A | 1/2017 |

*Primary Examiner* — Wasiul Haider
(74) *Attorney, Agent, or Firm* — Francois Pagette; Hoffman Warnick LLC (57) ABSTRACT

A structure includes trigger control circuitry for an SCR including: a first transistor having two P-type semiconductor terminals connected to an Nwell and a Pwell of the SCR; a second transistor having two N-type semiconductor terminals connected to the Pwell and ground; and, optionally, an additional transistor having two P-type semiconductor terminals connected to the Nwell and ground. Control terminals of the transistors receive the same control signal (e.g., RST from a power-on-reset). When a circuit connected to the SCR for ESD protection is powered on, ESD risk is limited so RST switches to high. Thus, the first transistor and optional additional transistor turn off and the second transistor turns on, reducing leakage. When the circuit is powered down, the ESD risk increases so RST switches to low. Thus, the first transistor and optional additional transistor turn on and the second transistor turns off, lowering the trigger voltage and current.

20 Claims, 10 Drawing Sheets

(56) References Cited

U.S. PATENT DOCUMENTS

| | | |
|---|---|---|
| 2009/0212323 A1 | 8/2009 | Liu et al. |
| 2010/0103570 A1* | 4/2010 | Song .................. H01L 27/0262 |
| | | 257/E29.211 |
| 2013/0308231 A1 | 11/2013 | Shan et al. |
| 2022/0131369 A1 | 4/2022 | Loiseau et al. |

* cited by examiner

OPERATING VOLTAGE-TRIGGERED SEMICONDUCTOR CONTROLLED RECTIFIER

BACKGROUND

Field of the Invention

The present invention relates to semiconductor controlled rectifiers (SCRs) and, more particularly, to embodiments of an operating voltage-triggered SCR.

Description of Related Art

Fails due to electrostatic discharge (ESD) negatively impact the reliability of integrated circuits (ICs). IC designs typically include ESD protection devices (e.g., at input/output pads, at power pads, and between power domains). Semiconductor-controlled rectifiers (SCRs) (e.g., silicon-controlled rectifiers) can be employed as ESD devices. However, at advanced technology nodes, SCRs, which are typically diode-triggered, are limited by high leakage and high trigger voltages, which may be too high to provide ESD protection (i.e., before the trigger voltage is reached, some voltage lower than the trigger voltage may damage the circuit or device requiring ESD protection).

SUMMARY

Embodiments of a structure disclosed herein can include a first transistor and a second transistor. The first transistor can have a P-type semiconductor terminal and an additional P-type semiconductor terminal. The second transistor can have an N-type semiconductor terminal and an additional N-type semiconductor terminal. The structure can further include a PNP bipolar junction transistor and an NPN bipolar junction transistor. The P-type semiconductor terminal of the first transistor, a P-type collector of the PNP bipolar junction transistor, a P-type base of the NPN bipolar junction transistor, and the additional N-type semiconductor terminal of the second transistor can be electrically connected. The additional P-type semiconductor terminal of the first transistor, an N-type base of the PNP bipolar junction transistor, and an N-type collector of the NPN bipolar junction transistor can be electrically connected. Additionally, the N-type semiconductor terminal of the second transistor and an N-type emitter of the NPN bipolar junction transistor can be electrically connected.

Some embodiments of a structure disclosed herein can include a first transistor and a second transistor. The first transistor can have a P-type semiconductor terminal and an additional P-type semiconductor terminal. The second transistor can have an N-type semiconductor terminal and an additional N-type semiconductor terminal. The structure can further include a PNP bipolar junction transistor and an NPN bipolar junction transistor. The P-type semiconductor terminal of the first transistor, a P-type collector of the PNP bipolar junction transistor, a P-type base of the NPN bipolar junction transistor, and the additional N-type semiconductor terminal of the second transistor can be electrically connected. The additional P-type semiconductor terminal of the first transistor, an N-type base of the PNP bipolar junction transistor, and an N-type collector of the NPN bipolar junction transistor can be electrically connected. Additionally, the N-type semiconductor terminal of the second transistor and an N-type emitter of the NPN bipolar junction transistor can be electrically connected to a pull-down node. The structure can further include an additional transistor with P-type semiconductor terminals and connected in series between the first transistor and the pull-down node.

Additional embodiments of a structure disclosed herein can include a first transistor and a second transistor. The first transistor can have a P-type semiconductor terminal and an additional P-type semiconductor terminal. The second transistor can have an N-type semiconductor terminal and an additional N-type semiconductor terminal. The structure can further include a PNP bipolar junction transistor and an NPN bipolar junction transistor. The P-type semiconductor terminal of the first transistor, a P-type collector of the PNP bipolar junction transistor, a P-type base of the NPN bipolar junction transistor, and the additional N-type semiconductor terminal of the second transistor can be electrically connected. The additional P-type semiconductor terminal of the first transistor, an N-type base of the PNP bipolar junction transistor, and an N-type collector of the NPN bipolar junction transistor can be electrically connected. The N-type semiconductor terminal of the second transistor and an N-type emitter of the NPN bipolar junction transistor can be electrically connected. The structure can further include a power-on-reset (POR), which is connected to control on/off states of the first transistor and the second transistor.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A-1 and 1A-2 are schematic and exemplary cross-section diagrams, respectively, illustrating an embodiment of a structure disclosed herein and including an SCR and trigger control circuitry for the SCR FIGS. 1B-1 and 1B-2 are schematic and exemplary cross-section diagrams, respectively, illustrating another embodiment of a structure disclosed herein and including an SCR and trigger control circuitry for the SCR;

DETAILED DESCRIPTION

As mentioned above, fails due to ESD negatively impact the reliability of ICs. IC designs typically include ESD protection devices (e.g., at input/output pads, at power pads, and between power domains). SCRs (e.g., silicon-controlled rectifiers) can be employed as ESD devices. However, at advanced technology nodes, SCRs, which are typically diode-triggered, are limited by high leakage and high trigger voltages, which may be too high to provide ESD protection (i.e., before the trigger voltage is reached, some voltage lower than the trigger voltage may damage the circuit or device requiring ESD protection).

In view of the foregoing, disclosed herein are embodiments of a structure including an operating voltage-triggered SCR. Specifically, the structure can include an SCR and trigger control circuitry for the SCR. The trigger control circuitry can include: a first transistor, which has two P-type semiconductor terminals (e.g., connected to an Nwell and a Pwell of the SCR, as discussed in greater detail below); a second transistor, which has two N-type semiconductor terminals (e.g., connected to the Pwell and ground, as discussed in greater detail below); and, optionally, an additional transistor, which has also has P-type semiconductor terminals (e.g., connected to the Nwell and ground, as discussed in greater detail below). The transistors of the trigger control circuitry can be, for example, field effect transistors (FETs), lateral double-diffused metal oxide semiconductor field effect transistors (LDMOSFETs), bipolar junction transistors (BJTs), etc. In any case, these transistors can have corresponding control terminals that receive the same control signal and this control signal can automatically switch states depending upon the risk that an ESD will damage component(s) connected to the SCR for ESD protection. For example, when the risk of ESD damage is low, the control signal can switch to a high state to turn off the first transistor and optional additional transistor (if applicable) and turn on the second transistor, thereby reducing leakage. However, when the risk of ESD damage is high, the control signal can switch to a low state to turn on the first transistor and the optional additional transistor (if applicable) and turn off the second transistor, thereby triggering SCR operation at a relative low trigger voltage and current. Since the risk of ESD damage is low when a circuit is powered on and high when the circuit is powered down, such a control signal can be a reset signal (RST) provided by POR because a POR can be configured to change the state of RST depending upon current operating voltage. Thus, the SCR in the disclosed structure embodiments can be operating voltage-triggered and advantages of such an operating voltage-triggered SCR, include, but are not limited to reduced leakage leading to reduced power consumption and reduced trigger voltage and current leading to a reduced risk of ESD damage prior to the operation of the SCR being triggered.

Figure 1A:
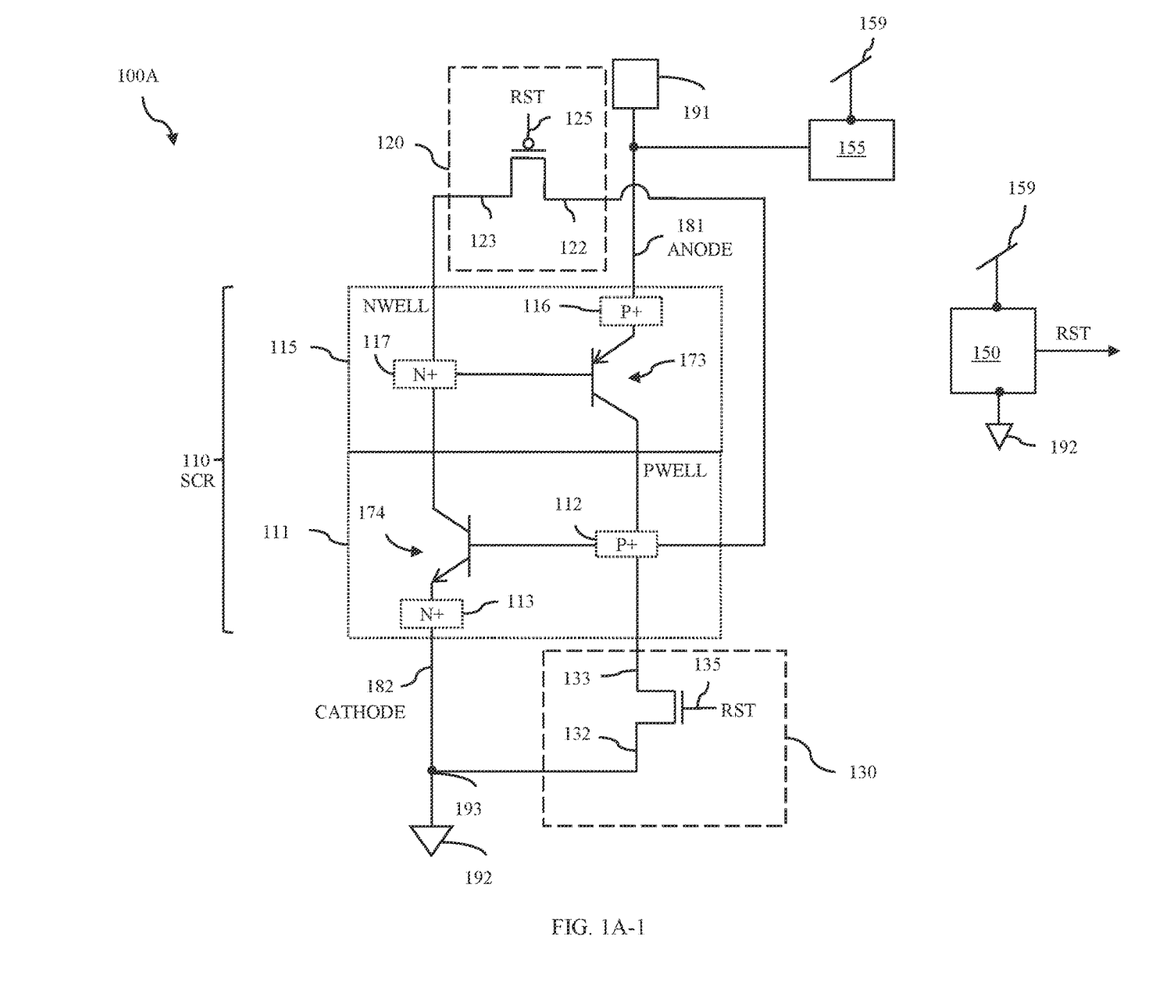
Figure 1A:
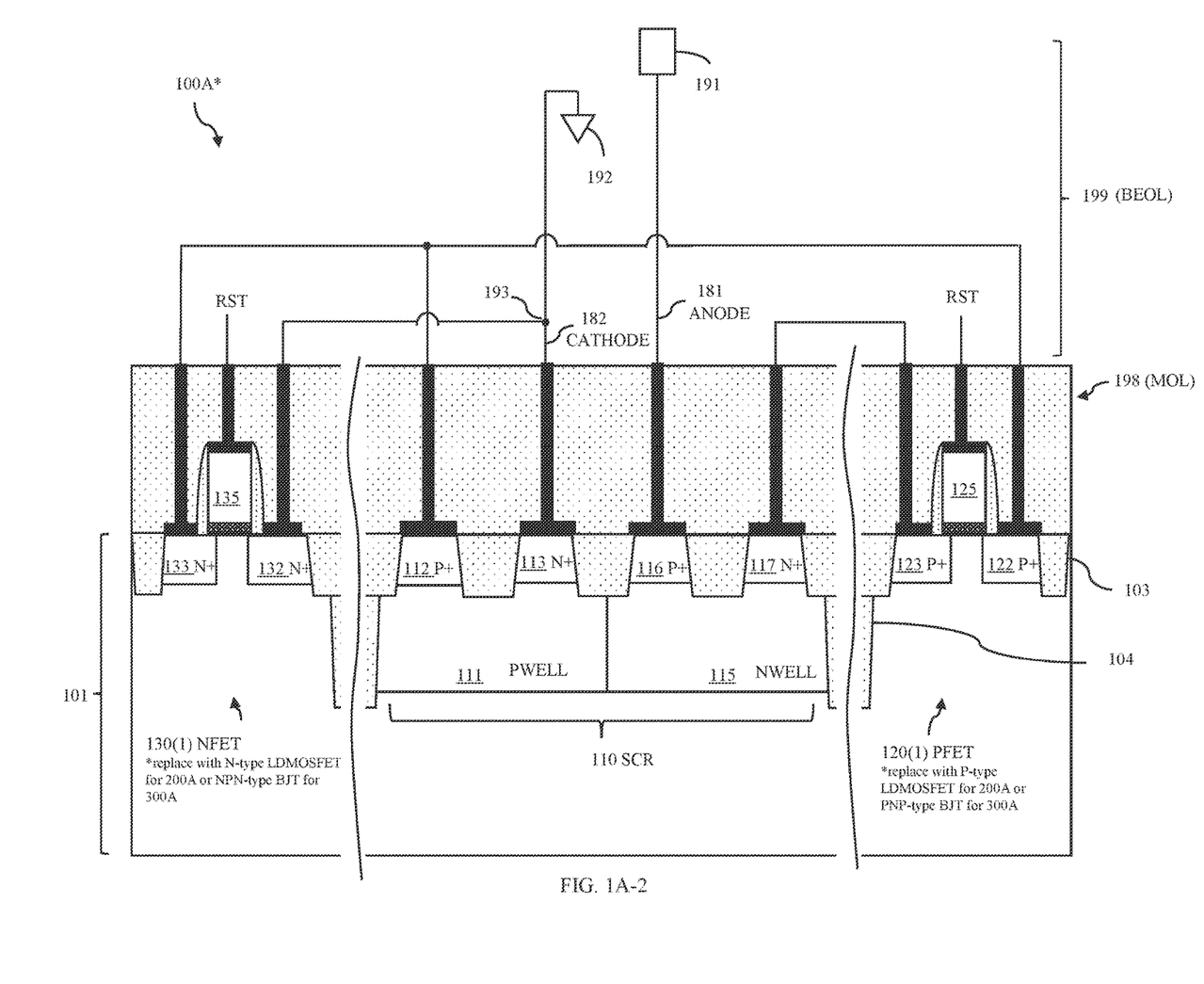
Figure 1B:
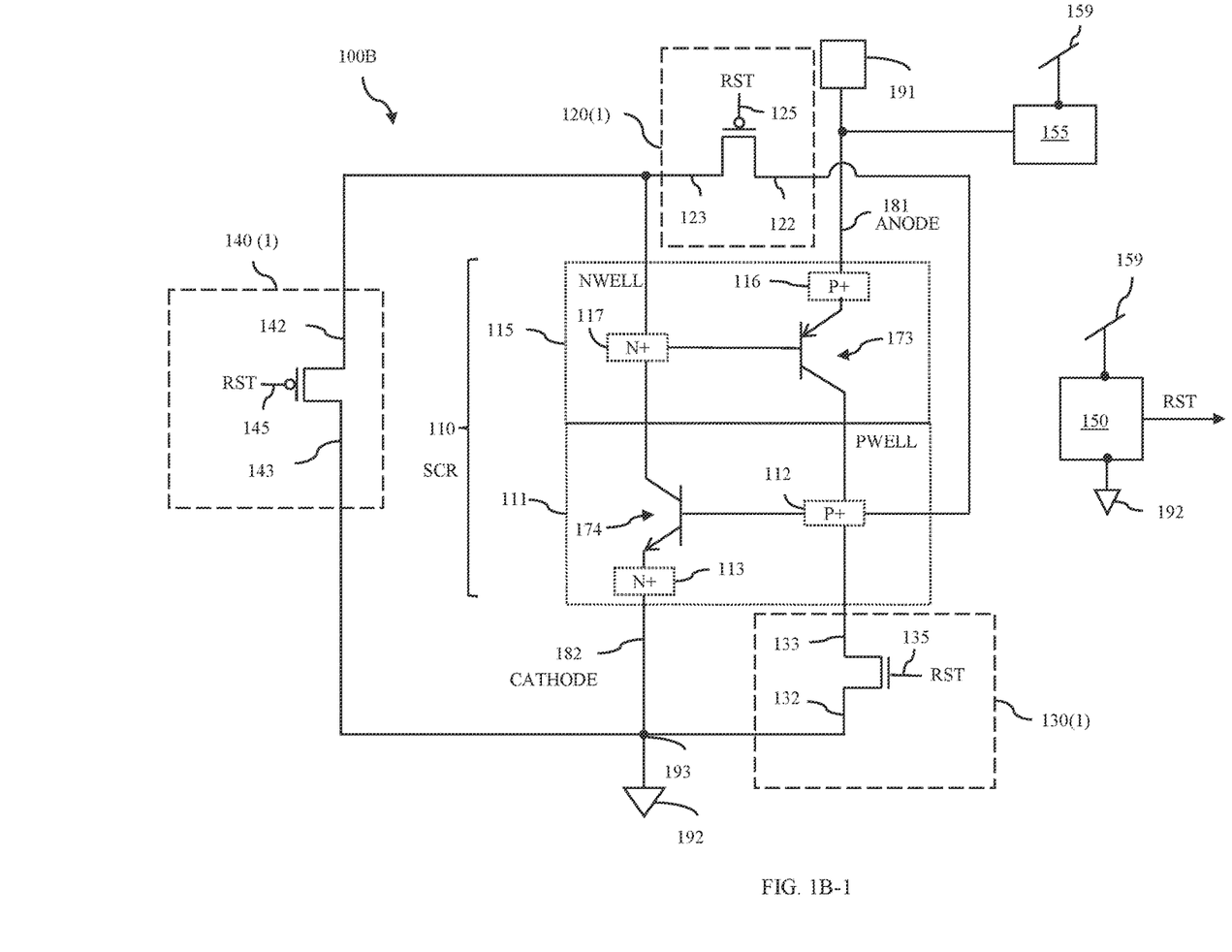
Figure 1B:
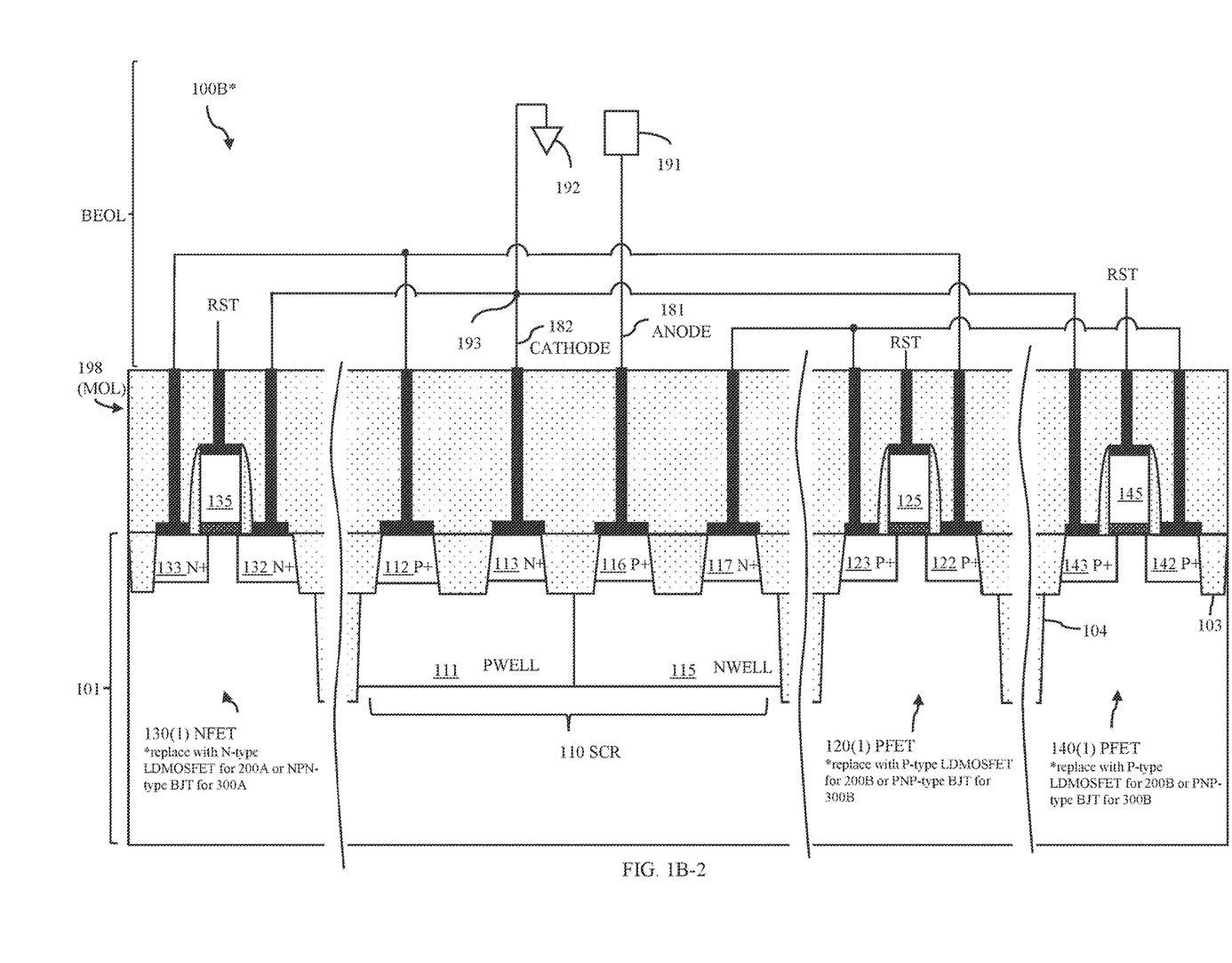
Figure 2A:
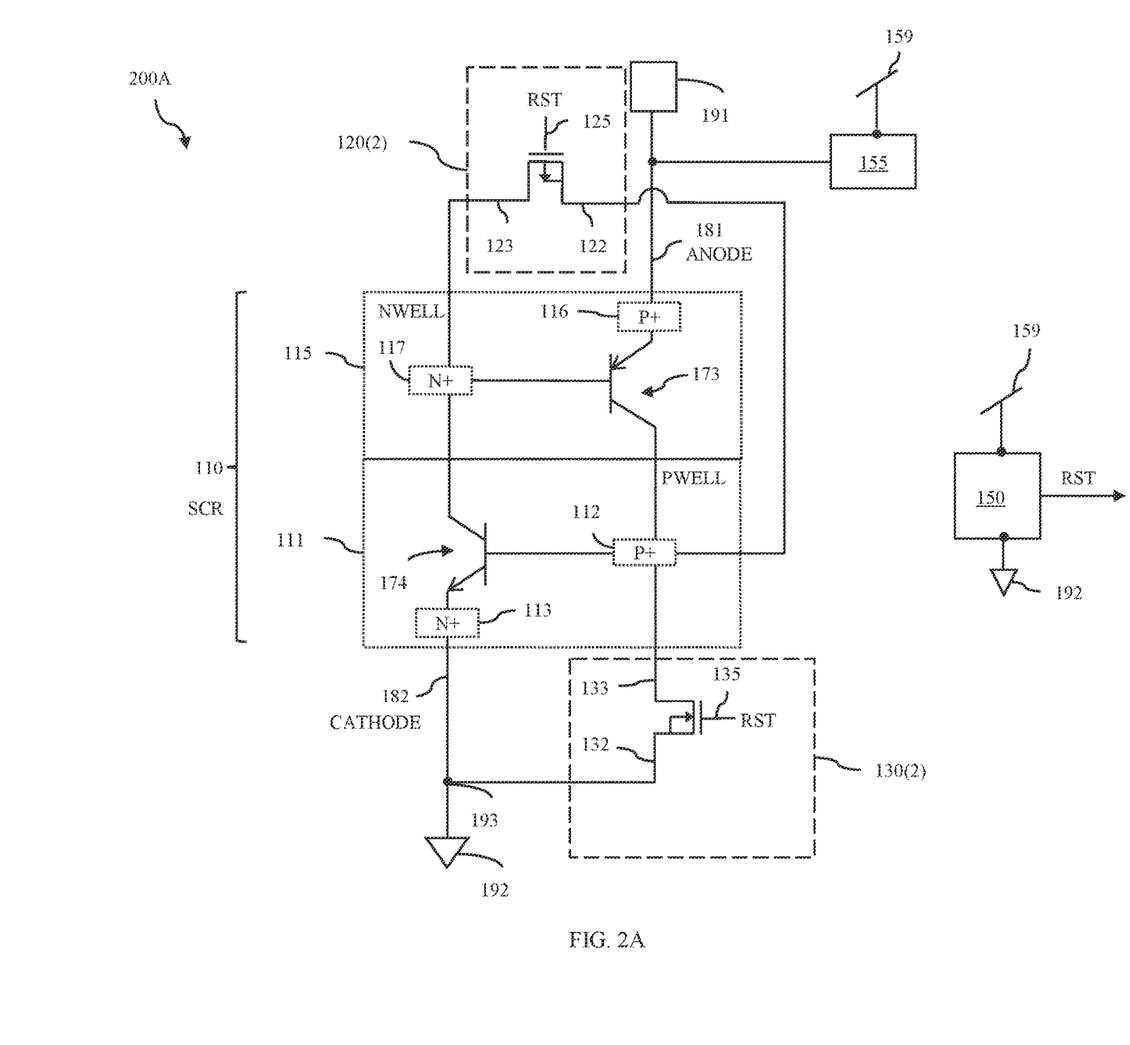
FIGS. 2A, 2B, 3A and 3B are schematic diagrams illustrating additional embodiments, respectively, of a structure disclosed herein and including an SCR and trigger control circuitry for the SCR.
Figure 2B:
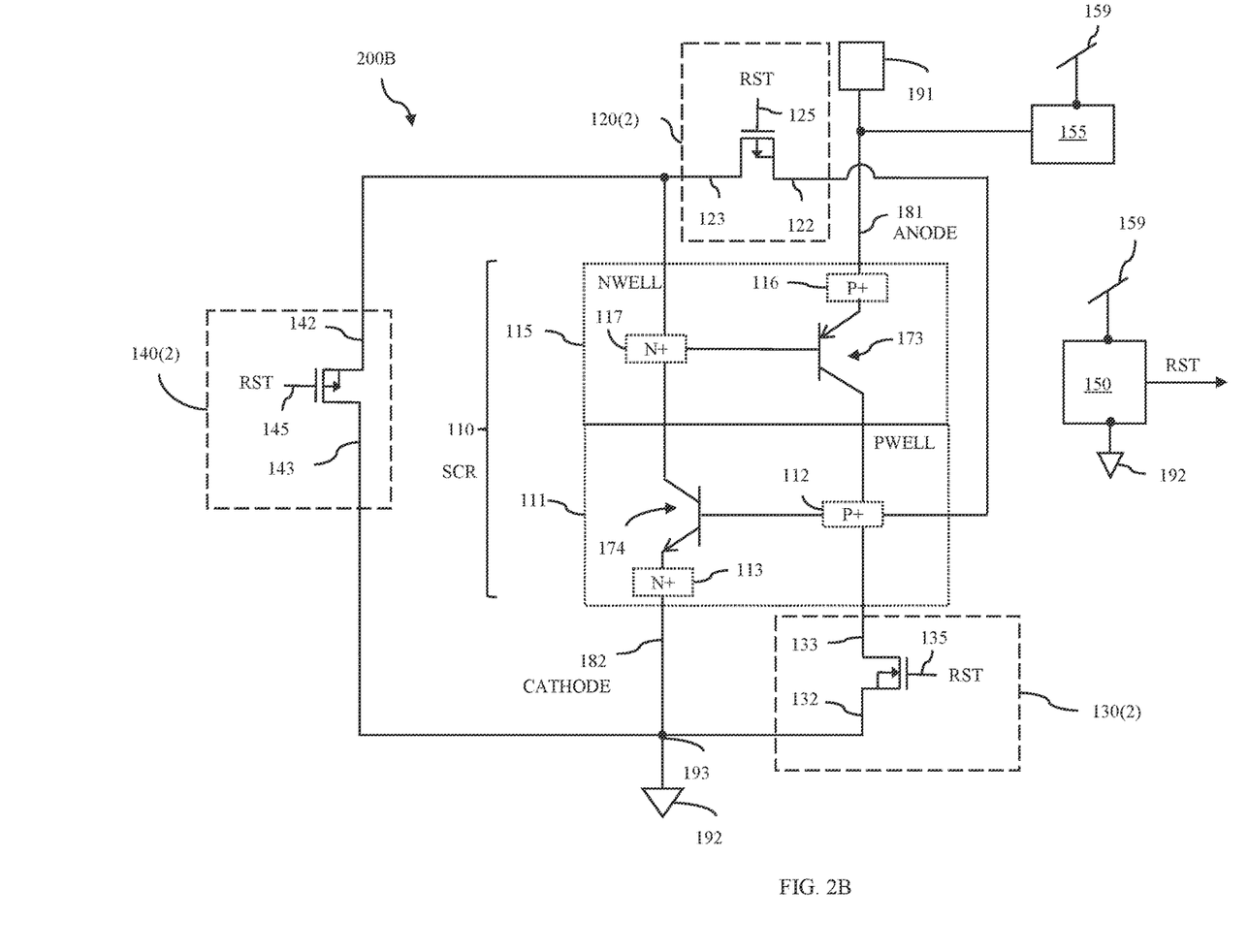

More particularly, disclosed herein are embodiments of an integrated circuit (IC) structure (e.g., a radio frequency integrated circuit (RFIC) structure. FIGS. 1A-1 and 1A-2 are schematic and exemplary cross-section diagrams, respectively, illustrating one embodiment of the structure 100A. FIGS. 1B-1 and 1B-2 are schematic and exemplary cross-section diagrams, respectively, illustrating another embodiment of the structure 100B. FIGS. 2A, 2B, 3A and 3B are schematic diagrams illustrating additional embodiments, respectively, of the structure 200A, 200B, 300A and 300B. The structure 100A, 100B, 200A, 200B, 300A, 300B can include multiple semiconductor devices and, particularly, multiple transistors that are interconnected to form a SCR 110 (e.g., a silicon controlled rectifier or the like) and to also form the trigger control circuitry for the SCR 110.

Specifically, the transistors can include a first transistor 120, a second transistor 130 and, optionally, an additional transistor 140 (see the structures 100B, 200B, 300B) for the trigger control circuitry as well as a PNP BJT 173 and an NPN BJT 174 for the SCR 110. The first transistor 120, the second transistor 130 and the optional additional transistor 140 can be, for example, FETs, LDMOSFETs, BJTs, HBTs, etc., as discussed in greater detail below.

In some embodiments, the first transistor 120, the second transistor 130, and the optional additional transistor 140 can all be FETs (e.g., see FETs 120(1) and 130(1) in the structure 100A of FIGS. 1A-1 and 1A-2; see also FETs 120(1), 130(1) and 140(1) in the structure 100B of FIGS. 1B-1 and 1B-2). Those skilled in the art will recognize that generally a FET includes: a pair of source/drain terminals having the same type conductivity; a channel region between the source/drain terminals and having either the opposite type conductivity or being undoped (i.e., intrinsic); and a control terminal and, particularly, a gate adjacent to the channel region. The on/off states of the FET (i.e., whether the channel region of the FET is conductive or not) can be dependent upon specific terminal bias conditions including a gate voltage. In P-type FETs (PFETs), the source/drain terminals have P-type conductivity at a relatively high conductivity level (e.g., are P+ source/drain regions), whereas in N-type FETs (NFETs), the source/drain terminals have relatively high N-type conductivity (e.g., are N+ source/drain regions). A PFET will typically turn on in response to a negative or ground voltage pulse on the gate (e.g., in response to a control signal in a low state (0)) and turn off in response to a positive voltage pulse on the gate (e.g., in response to a control signal in a high state (1)). An NFET will typically turn on in response to a positive voltage pulse on the gate (e.g., in response to a control signal in a high state) and turn off in response to a negative or ground voltage pulse on the gate (e.g., in response to a control signal in a low state (0)).

In other embodiments, the first transistor 120, second transistor, 130 and optional additional transistor 140 can be all FETs but more specifically all LDMOSFETs (e.g., see LDMOSFETs 120(2) and 130(2) in the structure 200A of FIG. 2A; see also LDMOSFETs 120(2), 130(2) and 140(2) in the structure 200B of FIG. 2B). Those skilled in the art will recognize that LDMOSFETs have the same FET features described above (e.g., source/drain terminals, a channel region between the source/drain terminals, and a gate adjacent to the channel region) with some modifications designed to provide the relatively high breakdown voltage (BV) required for radio frequency (RF) applications. For example, in LDMOSFETs, the source/drain terminals can be asymmetric with respect to the channel region and, more particularly, the channel region can be positioned closer to the source region than it is to the drain region and the space between the channel region and the drain region can include a relatively low-doped drain drift region.

Figure 3A:
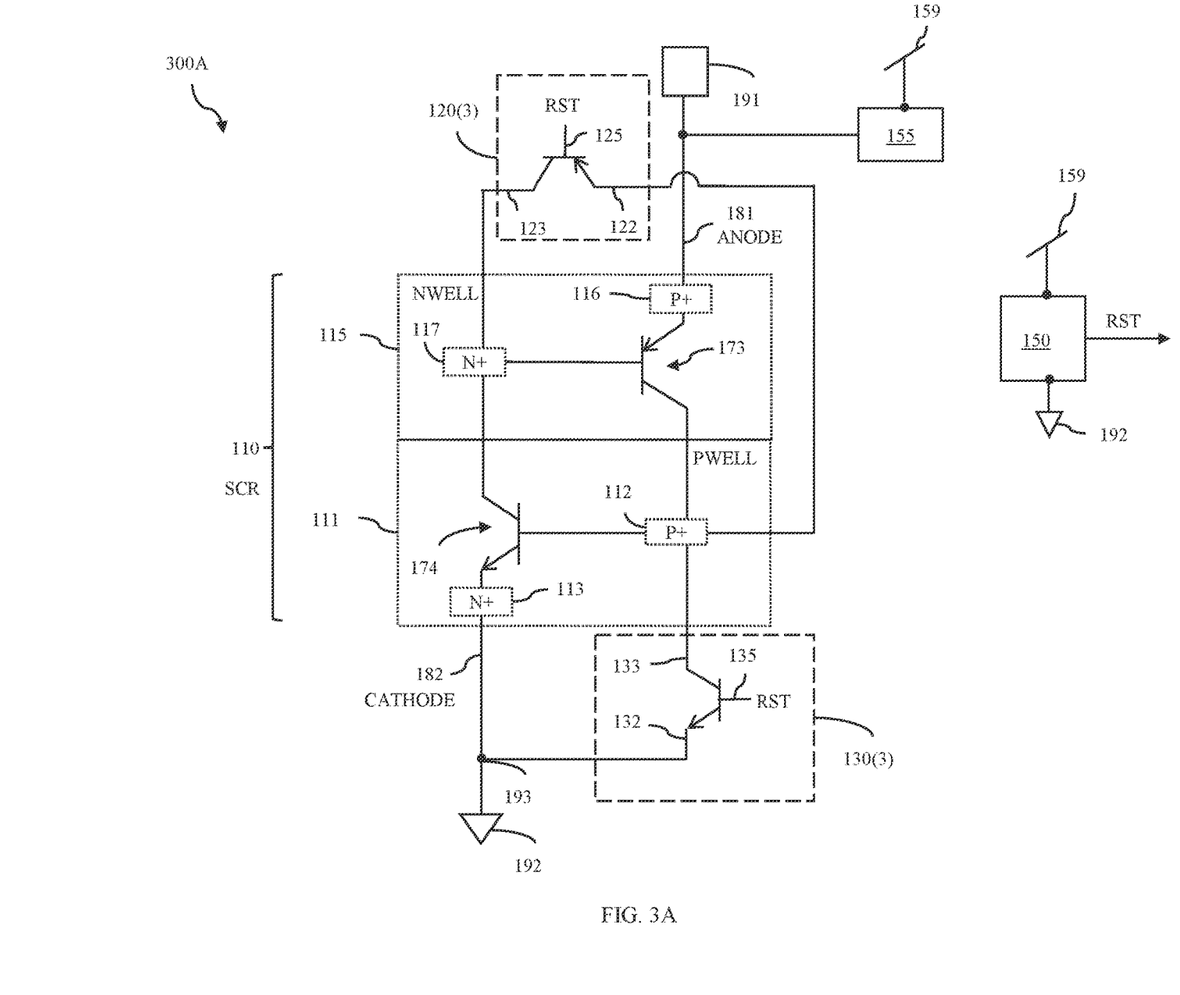
Figure 3B:
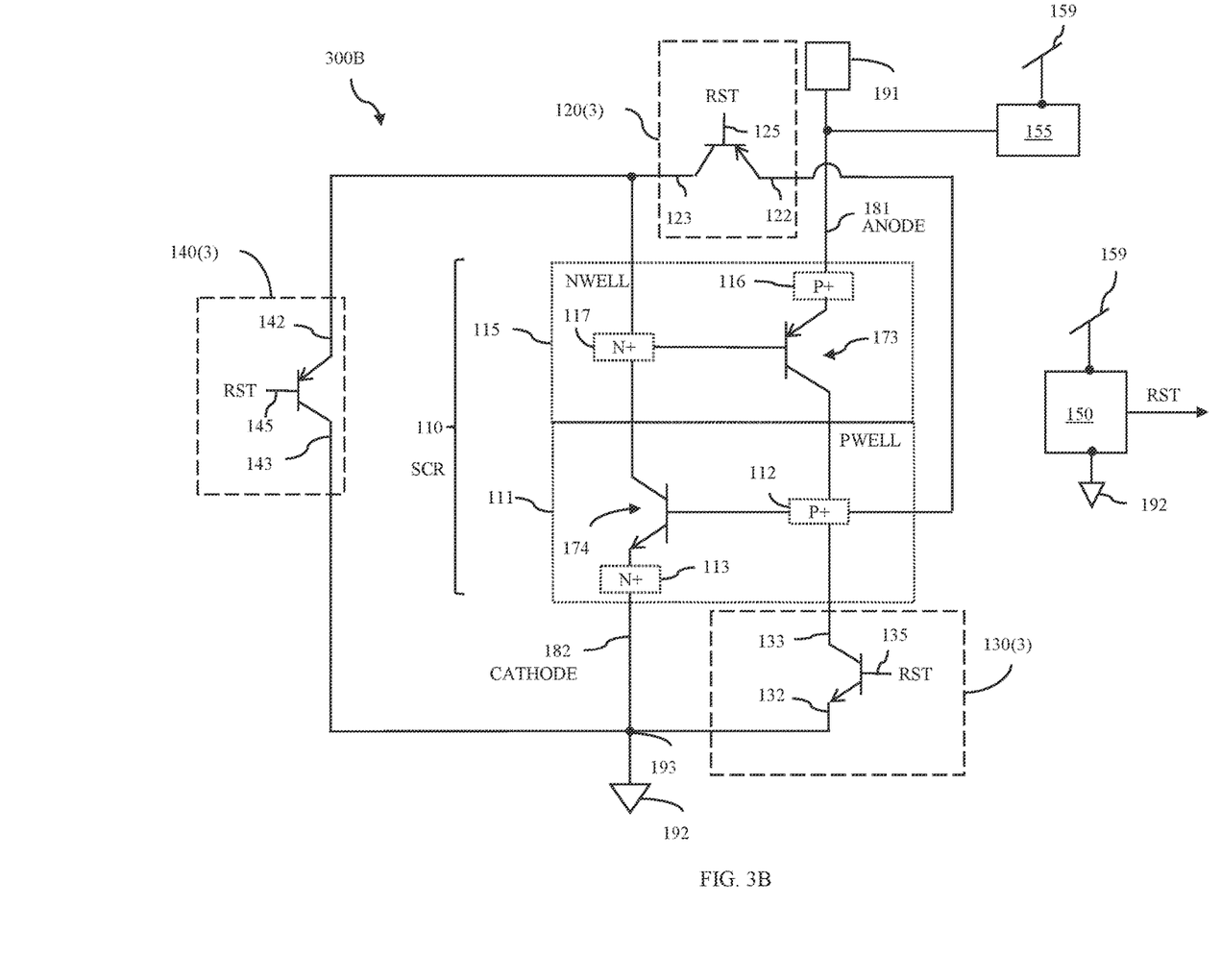

In still other embodiments, the first transistor 120, second transistor 130, and optional additional transistor 140 could be other types of transistors, such as all BJTs (e.g., see BJTs 120(3) and 130(3) in the structure 300A of FIG. 3A; see also BJTs 120(3), 130(3) and 140(3) in the structure 300B of FIG. 3B). Those skilled in the art will recognize that generally a BJT includes: an emitter terminal and a collector terminal having the same type conductivity; and a control terminal and, particularly, a base terminal between the emitter terminal and the collector terminal and having at least some portion with the opposite type conductivity. The on/off states of the BJT (i.e., whether BJT is conductive or not) can be dependent upon specific terminal bias conditions including a base voltage. In PNP BJTs, the emitter and collector terminals have P-type conductivity at relatively high conductivity level (e.g., are P+ emitter and collector regions) and an N-type base terminal, whereas in NPN BJTs, the emitter and collector terminals have relatively high N-type conductivity (e.g., are N+ source/drain regions) and a P-type base terminal. A PNP BJT will typically turn on in response to a negative or ground voltage pulse on the base (e.g., in response to a control signal in a low state (0)) and turn off in response to a positive voltage pulse on the base (e.g., in response to a control signal in a high state (1)). An NPN BJT will typically turn on in response to a positive voltage pulse on the base (e.g., in response to a control signal in a high state) and turn off in response to a negative or ground voltage pulse on the base (e.g., in response to a control signal in a low state (0)).

Regardless of the transistor type, the first transistor 120 can include two P-type semiconductor terminals 122-123 (referred to as a P-type semiconductor terminal 122 and an additional P-type semiconductor terminal 123) and a corresponding control terminal 125, the second transistor 130 can include two N-type semiconductor terminals (referred to as an N-type semiconductor terminal 132 and an additional N-type semiconductor terminal 133) and a corresponding control terminal 135; and the optional additional transistor 140 can include two P-type semiconductor terminals 142-143 and a corresponding control terminal 145.

For example, as illustrated in the structure 100A of FIGS. 1A-1 and 1A-2, in the structure 100B of FIGS. 1B-1 and 1B-2, in the structure 200A of FIG. 2A and in the structure 200B of FIG. 2B, the first transistor can be a PFET 120(1) or P-type LDMOSFET 120(2) including: P-type semiconductor terminals 122-123 (e.g., P+ source/drain terminals); a channel region (e.g., an N− channel region or an intrinsic channel region) between the P-type semiconductor terminals 122-123; and a corresponding control terminal 125 and, particularly, a gate adjacent to the channel region. The optional additional transistor can be an additional PFET 140(1) or an additional P-type LDMOSFET 140(2) including P-type semiconductor terminals 142-143 (e.g., P+ source/drain terminals); a channel region (e.g., an N− channel region or an intrinsic channel region) between the P-type semiconductor terminals 142-143; and a corresponding control terminal 145 and, particularly, a gate adjacent to the channel region. The second transistor can be an NFET 130(1) or N-type LDMOSFET 130(2) including: N-type semiconductor terminals 132-133 and, particularly, N-type source/drain terminals at a relatively high N-type conductivity level (e.g., N+ source/drain terminals); a channel region (e.g., a P-channel region or an intrinsic channel region) between the N-type semiconductor terminals 132-133; and a corresponding control terminal 135 and, particularly, a gate adjacent to the channel region. It should be understood that various different FET and LDMOSFET configurations are well known in the art and could be incorporated into the trigger control circuitry.

Alternatively, as illustrated in the structure 300A of FIG. 3A and in the structure 300B of FIG. 3B, the first transistor can be an additional PNP BJT 120(3) including P-type semiconductor terminals 122-123 (e.g., P+ emitter/collector terminals) and a corresponding control terminal 125 (e.g., a N-type base terminal) between the P-type semiconductor terminals 122-123. The optional additional transistor, as shown in FIG. 3B, can be another additional PNP BJT including P-type semiconductor terminals 142-143 (e.g., P+ emitter/collector terminals) and a corresponding control terminal 145 (e.g., an N-type base terminal) between the P-type semiconductor terminals 142-143. The second transistor can be an additional NPN BJT 130(3) including N-type semiconductor terminals 132-133 (e.g., N+ emitter/collector terminals) and a corresponding control terminal 135 (e.g., a P-type base terminal) between the N-type semiconductor terminals 132-133. It should be understood that various different BJT configurations (e.g., lateral BJTs, lateral heterojunction bipolar transistors (HBT), etc.) are well known in the art and could be incorporated into the trigger control circuitry.

In the SCR 110, the PNP BJT 173 can include a P-type emitter (e.g., see P+ region 116), a P-type collector (see Pwell 111 and P+ region 112), and an N-type base (see Nwell 115 and N+ region 117) between and abutting the P-type emitter and the P-type collector. The NPN BJT 174 can include an N-type emitter (see the N+ region 113), an N-type collector (see Nwell 115 and N+ region 117), and a P-type base (see Pwell 111 and P+ region 112), which is between the N-type emitter and the N-type collector.

As mentioned above, the PNP BJT 173, the NPN BJT 174, the first transistor 120, the second transistor 130 and the optional additional transistor 140 (if applicable) can be interconnected so that the structure 100A, 100B, 200A, 200B, 300A, 300B includes an SCR 110 and trigger control circuitry for the SCR 110.

Specifically, the PNP BJT 173 and the NPN BJT 174 can be interconnected as follows to form the SCR 110. The P-type emitter (P+ region 116) of the PNP BJT 173 can be electrically connected to a pad 191 and can be the anode terminal 181 of the SCR 110. The pad 191 can be, for example, an input/output pad, a power pad, etc. Optionally, an additional circuit 155 (e.g., a transceiver front-end or other circuit) can also be electrically connected to this pad 191 and to the SCR 110 for ESD protection. The P-type collector of the PNP BJT 173 and the P-type base of the NPN BJT 174 can be electrically connected and, optionally, can share the same P-type semiconductor regions (i.e., Pwell 111 and P+ region 112). Additionally, the N-type collector of the NPN BJT 174 and the N-type base of the PNP BJT 173 can be electrically connected and, optionally, can share the same N-type semiconductor regions (i.e., Nwell 115 and N+ region 117). The N-type emitter (i.e., N+ region 113) of the NPN BJT 174 can be connected to a pull-down node 193 and, thereby to a ground rail 192, and can be the cathode terminal 182 of the SCR 110.

FIG. 1A-2 is a cross-section diagram illustrating one exemplary cross-section of the structure 100A. However, this same cross-section diagram also illustrates the corresponding features in the structure 200A of FIG. 2A and 300A of FIG. 3A (including the SCR 110, MOL contacts 198 and BEOL wiring 199) with the understanding that the FETs 120(1) and 130(1) would be replaced with LDMOSFETs 120(2) and 130(2) in the structure 200A of FIG. 2A or with BJTs 120(3) and 130(3) in the structure 300A of FIG. 3A, as indicated. Similarly, FIG. 1B-2 is a cross-section diagram illustrating one exemplary cross-section of the structure 100B. However, this same cross-section diagram also illustrates the corresponding features in the structure 200B of FIG. 2B and 300B of FIG. 3B (including the SCR 110, MOL contacts 198 and BEOL wiring 199) with the understanding that the FETs 120(1), 130(1) and 140(1) would be replaced with LDMOSFETs 120(2), 130(2) and 140(2) in the structure 200B of FIG. 2B or with BJTs 120(3), 130(3) and 140(3) in the structure 300B of FIG. 3B, as indicated.

Referring to FIGS. 1A-2 and 1B-2, the structure could further include, for example, a semiconductor substrate 101. The semiconductor substrate 101 could be, for example, a bulk semiconductor substrate, as illustrated. This bulk semiconductor substrate can be, for example, a bulk monocrystalline silicon substrate or a monocrystalline substrate of some other suitable semiconductor material. Alternatively, this semiconductor substrate could be a semiconductor layer of a semiconductor-on-insulator structure (e.g., a monocrystalline silicon layer of a silicon-on-insulator (SOI) structure). The semiconductor substrate can have a bottom surface and a top surface opposite the bottom surface. A lower portion of the semiconductor substrate 101 adjacent to the bottom surface can have, for example, P-type conductivity at a relatively low P-type conductivity level (e.g., the lower portion can be a P− portion of the semiconductor substrate).

The SCR 110 can include Pwell 111 and Nwell 115 within the semiconductor substrate 101 adjacent to the top surface. The Pwell 111 and Nwell 115 can be dopant implant regions having P-type conductivity and N-type conductivity, respectively. The Pwell 111 can have a higher P-type conductivity than the lower portion of the semiconductor substrate 101. Furthermore, the Nwell 115 can be positioned laterally immediately adjacent to the Pwell 111, thereby forming a PN junction within the semiconductor substrate at the interface between the two wells.

The SCR 110 can further include, in the Pwell 111 at the top surface of the semiconductor substrate 101, a first P-type region 112 that forms a contact to the Pwell 111 and a first N-type region 113 that forms a PN junction with the Pwell 111. The first P-type region 112 and the first N-type region 113 can be relatively shallow as compared to the Pwell 111. That is, the depths of the bottoms of the first P-type region 112 and the first N-type region 113, as measured from the top surface of the semiconductor substrate 101, can be less than the depth of the Pwell 111. The SCR 110 can further include, in the Nwell 115 at the top surface of the semiconductor substrate 101, a second P-type region 116 that forms a PN junction with the Nwell 115 and a second N-type region 117 that forms a contact to the Nwell 115. The second P-type region 116 and the second N-type region 117 can be relatively shallow as compared to the Nwell 115. That is, the depths of the bottoms of the second P-type region 116 and the second N-type region 117, as measured from the top surface of the semiconductor substrate 101, can be less than the depth of the Nwell 115. The first P-type region 112 and the second P-type region 116 can have a higher P-type conductivity than the Pwell 111. That is, these P-type regions 112 and 116 can be P+ regions. Similarly, the first N-type region 113 and the second N-type region 117 can have a higher N-type conductivity than the Nwell 115. That is, these N-type regions 113 and 117 can be N+ regions. The first P-type region 112, the first N-type region 113, the second P-type region 116 and the second N-type region 117 can each be positioned laterally between and, more particularly, can be laterally surrounded by isolation regions 103. The isolation regions 103 can be, for example, shallow trench isolation (STI) regions. Additional isolation regions 104 (e.g., deep trench isolation (DTI) regions) can, optionally, isolate the Pwell 111 and Nwell 115 from other device regions on the semiconductor substrate.

In this configuration, the P+ region 116 can be the P-type emitter of the PNP BJT 173 and can be electrically connected via MOL and BEOL interconnects to pad 191. Pwell 111 and P+ region 112 can be shared P-type semiconductor regions for the P-type collector of the PNP BJT 173 and for the P-type base of the NPN BJT 174. Nwell 115 and N+ region 117 can be the shared N-type semiconductor regions for the N-type collector of the NPN BJT 174 and the N-type base of the PNP BJT 173. N+ region 113 can be the N-type emitter of the NPN BJT 174 and can be electrically connected to the pull-down node 193 and, thereby to the ground rail 192 via MOL and BEOL interconnects.

The SCR 110 including the PNP BJT 173 and the NPN BJT 174 can further be electrically connected by MOL and BEOL interconnects (i.e., contacts 198 and wiring 199) to trigger control circuitry and, particularly, to the first transistor, the second transistor, and the optional additional transistors 140 (if applicable), which are located adjacent to the SCR or elsewhere on the semiconductor substrate 101. For example, as illustrated, P+ region 112 can be electrically connected by MOL and BEOL interconnects to the P-type semiconductor terminal 122 of the first transistor (e.g., to the source 112 of PFET 120(1) as illustrated or alternatively to the source of a P-type LDMOSFET 120(2) or to the emitter of an additional PNP BJT 120(3)) and to the N-type semiconductor terminal 133 of the second transistor (e.g., to the drain of the NFET 130(1) as illustrated or alternatively to the drain of a N-type LDMOSFET 130(2) or to the collector of an additional NPN BJT 130(3)). N+ region 113 and, more particularly, pull-down node 193 can further be electrically connected by MOL and BEOL interconnects to the N-type semiconductor terminal 132 of the second transistor (e.g., the source of the NFET 130(1) as illustrated or alternatively to the source of an N-type LDMOSFET 130(2) or to the emitter of an additional NPN BJT 130(3)) and, optionally, to the P-type semiconductor terminal 143 of an additional transistor (e.g., to the drain of an additional PFET 140(1) as illustrated or alternatively to the drain of an additional P-type LDMOSFET 140(2) or to the collector of an additional PNP BJT 140(3)). Finally, the N+ region 117 can be electrically connected by MOL and BEOL interconnects to the P-type semiconductor terminal 123 of the first transistor (e.g., to the drain of the PFET 120(1) as illustrated or alternatively to the drain of a P-type LDMOSFET 120(2) or to the collector of an additional PNP BJT 120(3)) and, optionally, to the P-type semiconductor terminal 142 of an additional transistor (e.g., to a source of an additional PFET 140(1) as illustrated or alternatively to the source of an additional P-type LDMOSFET 140(2) or to the emitter of an additional PNP BJT 140(3)).

Thus, in the above-described structure 100A, 100B, 200A, 200B, 300A, 300B, the on/off state of the first transistor 120 controls an electrical connection between the P+ region 112 (and, thus, the Pwell 111) and the N+ region 117 (and, thus, the Nwell 115). When a control signal on the control terminal of the first transistor 120 is at a high state, the first transistor will be off and will not electrically connect the P+ region 112 (and, thus, the Pwell 111) to the N+ region 117 (and, thus, the Nwell 115). When the control signal on the control terminal of the first transistor 120 is at a low state, the first transistor will be on and conductive so as to electrically connect the P+ region 112 (and, thus, the Pwell 111) to the N+ region 117 (and, thus, the Nwell 115). The on/off state of the second transistor 130 controls an electrical connection between the P+ region 112 (and, thus, the Pwell 111) and the pull-down node 193 connected to the ground rail 192. When a control signal on the control terminal of the second transistor 130 is at a high state, the second transistor will be on and conductive electrically connecting the P+ region 112 (and, thus, the Pwell 111) to a ground rail (i.e., pulling down the voltage level on the P+ region 112 and Pwell 111 to ground), whereas, when the control signal on the control terminal of the second transistor 130 is at a low state, the second transistor will be off and the P+ region 112 and Pwell 111 will not be connected directly to ground. The on/off state of the additional transistor 140 (if applicable) controls an electrical connection between the N+ region 117 (and, thus, the Nwell 115) and ground. When a control signal on the control terminal of the additional transistor 140 is at a low state, the additional transistor will be on and conductive electrically connecting the N+ region 117 (and, thus, the Nwell 115) to the ground rail, whereas, when the control signal on the control terminal of the additional transistor 140 is at a high state, the additional transistor will be off and the N+ region 117 and Nwell 115 will not be connected directly to ground.

In the disclosed embodiments, the control terminals of the various transistors of the trigger control circuitry (i.e., the first transistor, the second transistor, and the optional additional transistor (if applicable) as described above and illustrated in the figures) can receive the same control signal such that the first transistor 120 and, if applicable, the additional transistor 140 will be off when the second transistor 130 is on due to the control signal being in a high state and vice versa. Furthermore, the structure can be configured so that the state of the control signal automatically switches between the low state (e.g., ground or (0)) and a high state (e.g., Vdd or (1)) depending upon the risk that an ESD will cause damage to a circuit 155 (e.g., a transceiver or other circuit) connected to the pad 191 and to the SCR 110 for ESD protection. Typically, the risk of ESD damage to the circuit 155 will be low when the circuit 155 is powered on (i.e., when a positive supply voltage (Vdd) is on a positive supply voltage rail 159 connected to the circuit 155 and the circuit 155 is in a first mode and, particularly, a normal operating mode), whereas the risk of ESD damage to the circuit 155 is high when the circuit 155 is powered down (i.e., when Vdd is not on the positive supply voltage rail 159, such as when the positive supply voltage rail 159 is at ground, floating, or at least at some threshold level lower than Vdd and the circuit 155 is off or in a second mode). Thus, for example, the control signal (identified in the drawings as RST) can be operating voltage-dependent. That is, when the circuit 155 is powered on and there is a low risk of ESD damage, RST can be at the high state (e.g., 1) such that the first transistor 120 and additional transistor 140 (if applicable) are turned off and the second transistor 130 is on, thereby reducing leakage. However, when the circuit 155 is powered down, RST can switch to the low state to turn on the first transistor 120 and the additional transistor 140 (if applicable) and turn off the second transistor 130, triggering SCR operation at a relatively low trigger voltage and current to provide the necessary ESD protection.

Such an operating voltage-dependent control signal can be provided, for example, by a power-on-reset (POR). That is, in some embodiments, the structure 100A, 100B, 200A, 200B, 300A, 300B can further include a POR 150. The POR 150 can be connected to the positive supply voltage rail 159 and can be configured to output a control signal and, particularly, a reset signal (RST), where the state of RST is dependent on the power-on state of the circuit 155, which is connected to the pad 191 and to the SCR 110 for ESD protection. More particularly, RST can be dependent upon the voltage level on the positive supply voltage rail 159 that provides Vdd to the circuit 155. POR 150 can be configured to switch RST to a high state when the circuit 155 is powered on (e.g., when Vdd is on the rail 159) and the risk of ESD damage to the circuit 155 is low, thereby turning off the first transistor 120 and additional transistor 140 (if applicable) and turning on the second transistor 130. The POR 150 can further be configured to switch RST to the low state when the circuit 155 is powered down (e.g., when the voltage level on the rail 159 is at ground, floating or at least at some threshold level below Vdd) and the risk of ESD damage is high, thereby turning on the first transistor 120 and additional transistor 140 (if applicable) and turning off the second transistor 130.

Figure 4:
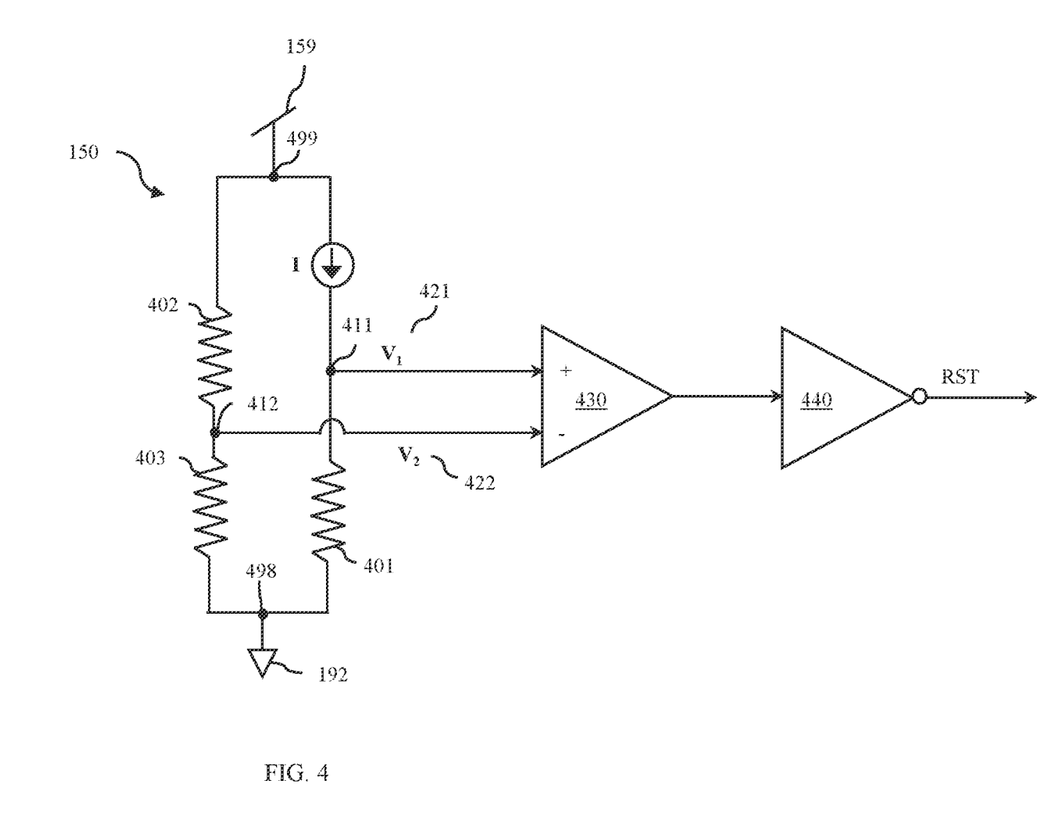
FIG. 4 is a schematic diagram illustrating an exemplary POR that can be incorporated into the various embodiments of the structure disclosed herein.

FIG. 4 is a schematic diagram illustrating one exemplary POR 150 that could be incorporated into the structure 100A, 100B, 200A, 200B, 300A, 300B. The POR 150 can have a first node 499 electrically connected to the positive supply voltage rail 159 for the circuit 155. The POR 150 can further include a second node 498 electrically connected to the ground rail 192. The POR 150 can further include multiple resistors. Specifically, the POR 150 can include a second branch with a first resistor 401 electrically connected between the first node 499 and the second node 498. The POR 150 can further include a second branch with a second resistor 402 and a third resistor 403 electrically connected in series between the first node 499 and the second node 498 (i.e., in parallel with the first branch). The POR 150 can further include a comparator 430 connected in series with an inverter 440. The comparator 430 can have a first input (i.e., a non-inverting input (+)) electrically connected to the first branch at a third node 411 at the junction between the first node 499 and the first resistor 401. The comparator 430 can also have a second input (i.e., an inverting input (−)) electrically connected to the second branch at a fourth node 412 at the junction between the second resistor 402 and the third resistor 403. The comparator 430 can receive a first voltage signal (V1) 421 at the non-inverting input (+) from node 411 and a second voltage signal (V2) 422 at the inverting input (−) from the node 412 and output an intermediate signal depending upon the difference between V1 and V2. The inverter 440 can output RST, which is inverted with respect to the intermediate signal. Specifically, when V1>V2, the intermediate output from the comparator 430 will be at a high state and RST from the inverter 440 will be low; whereas, when V1<V2, the intermediate output from the comparator 430 will be at a high state and RST will be at a low state.

Typically, a POR for a device would be designed (i.e., the resistance values of the resistors can be selected) so that RST is output at a low state until the voltage on a positive supply voltage rail rises above a threshold voltage level in order to avoid race conditions and device fails due to an insufficient positive supply voltage and to further output RST at a high state when correct operation is ensured. In response to RST switching to the high state, a state machine would, for example, initialize the device.

Figure 5:
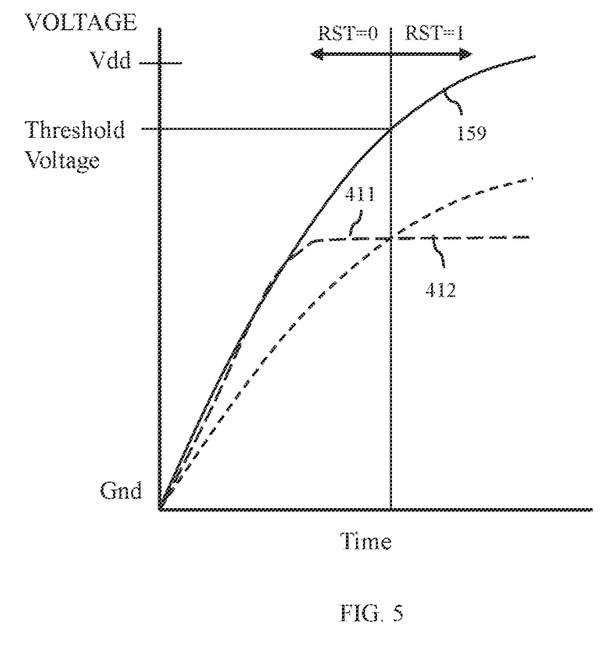
FIG. 5 is a graph illustrating voltage levels of various signals during POR operation.

The POR 150 that is incorporated into the disclosed structure 100A, 100B, 200A, 200B, 300A, 300B can be similarly designed (i.e., the resistance values of the resistors can be selected); however, instead of using a threshold voltage level above which the risk of ESD damage is low and below which the risk of ESD damage is sufficiently high to warrant ESD protection. Specifically, the POR 150 can be designed to output RST at a high state when the voltage on the positive supply voltage rail 159 rises above the threshold voltage level and to output RSD at a low state when the voltage on the positive supply voltage rail 159 drops below the threshold voltage level in order to trigger ESD protection by the SCR 110 when the risk of ESD damage increases above some acceptable level). As illustrated in the graph of FIG. 5, the resistors in the two branches of the POR 150 can be designed so that V1 on node 411 has a maximum voltage that is less than Vdd, so that V2 on node 412 is only equal to the maximum voltage of V1 at some point during powering on or powering down when the voltage on the positive supply voltage rail 159 is at the threshold voltage level, so that V2 is greater than V1 and RST is at the high state when the voltage on the positive supply voltage rail 159 is greater than the threshold voltage level and the re and so that V2 is less than V1 and RST is in the low state when the voltage on the positive supply voltage rail 159 is less than the threshold voltage level and the risk of ESD damage is high.

It should be understood that the figures are not intended to be limiting and that the POR shown in FIG. 4 is provided for illustration purposes. Various POR configurations are known in the art and could, alternatively, be incorporated into the structure 100A, 100B, 200A, 200B, 300A, 300B as POR 150.

In the above-described structure 100A, 100B, 200A, 200B, 300A, 300B, when the risk of ESD damage is low (i.e., when the circuit 155 is powered on during normal circuit operations (under normal DC conditions)), leakage is reduced because RST is high and, thus, the first transistor 120 between the P+ region 112/Pwell 111 and the N+ region 117/Nwell 115 is turned off and the additional transistor 140 (if applicable) between the N+ region/Nwell 115 and ground is also turned off. Furthermore, the trigger voltage and current are reduced when the risk of ESD damage increases (i.e., when the circuit 155 is powered down) because RST goes low and the first transistor 120 between the P+ region 112/Pwell 111 and the N+ region 117/Nwell 115 is turned on, the additional transistor 140 (if applicable) between the N+ region/Nwell 115 and ground is also turned on, and the second transistor 130 between the P+ region 112/Pwell 111 and ground is turned off.

In the description of the structure embodiments above, reference is made to semiconductor features including, but not limited to, substrates, layers, regions, portions, terminals, etc. and to the conductivity types (e.g., P-type or N-type) of those features. It should be understood that such features are made up of one or more semiconductor materials and a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve the different conductivity types (e.g., P-type conductivity and N-type conductivity) and that dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first transistor comprising a P-type semiconductor terminal and an additional P-type semiconductor terminal;
   a second transistor comprising an N-type semiconductor terminal and an additional N-type semiconductor terminal;
   a PNP bipolar junction transistor; and
   an NPN bipolar junction transistor,
   wherein the P-type semiconductor terminal of the first transistor, a P-type collector of the PNP bipolar junction transistor, a P-type base of the NPN bipolar junction transistor, and the additional N-type semiconductor terminal of the second transistor are electrically connected,
   wherein the additional P-type semiconductor terminal of the first transistor, an N-type base of the PNP bipolar junction transistor, and an N-type collector of the NPN bipolar junction transistor are electrically connected, and wherein the N-type semiconductor terminal of the second transistor and an N-type emitter of the NPN bipolar junction transistor are electrically connected.

2. The structure of claim 1, wherein the first transistor comprises a P-type field effect transistor and the second transistor comprises an N-type field effect transistor.

3. The structure of claim 1, wherein the first transistor comprises a P-type lateral double-diffused metal oxide semiconductor field effect transistor and the second transistor comprises an N-type lateral double-diffused metal oxide semiconductor field effect transistor.

4. The structure of claim 1, wherein the first transistor comprises an additional PNP bipolar junction transistor and the second transistor comprises an additional NPN bipolar junction transistor.

5. The structure of claim 1,
wherein the first transistor and the second transistor comprise corresponding control terminals connected to receive a reset signal, and
wherein the reset signal automatically switches between a first voltage in a first mode and a second voltage that is lower than the first voltage in a second mode.

6. The structure of claim 5, further comprising a power-on-reset connected to detect a power supply voltage, to output the reset signal at the first voltage when the power supply voltage is above a threshold level, and to output the reset signal at the second voltage when the power supply voltage is below the threshold level.

7. The structure of claim 1, further comprising: a semiconductor substrate having a top surface, wherein the first transistor, the second transistor, the PNP bipolar junction transistor, and the NPN bipolar junction transistor are on the semiconductor substrate, and wherein the PNP bipolar junction transistor and the NPN bipolar junction transistor are connected to form a semiconductor controlled rectifier.

8. The structure of claim 7,
wherein the semiconductor controlled rectifier comprises:
a Pwell in the semiconductor substrate;
an Nwell in the semiconductor substrate positioned laterally adjacent to the Pwell;
a first P-type region in the Pwell at the top surface;
a first N-type region in the Pwell at the top surface;
a second P-type region in the Nwell at the top surface; and
a second N-type region in the Pwell at the top surface,
wherein the first P-type region and the second P-type region have a higher P-type conductivity than the Pwell and wherein the first N-type region and the second N-type region have a higher N-type conductivity than the Nwell,
wherein the second P-type region, the Nwell and the first P-type region within the Pwell form a P-type emitter, the N-type base, and the P-type collector, respectively, of the PNP bipolar junction transistor, and
wherein the first N-type region, the Pwell and the second N-type region within the Nwell form the N-type emitter, the P-type base, and the N-type collector, respectively, of the NPN bipolar junction transistor.

9. A structure comprising:
a first transistor comprising a P-type semiconductor terminal and an additional P-type semiconductor terminal;
a second transistor comprising an N-type semiconductor terminal and an additional N-type semiconductor terminal;
a PNP bipolar junction transistor;
an NPN bipolar junction transistor,
wherein the P-type semiconductor terminal of the first transistor, a P-type collector of the PNP bipolar junction transistor, a P-type base of the NPN bipolar junction transistor, and the additional N-type semiconductor terminal of the second transistor are electrically connected,
wherein the additional P-type semiconductor terminal of the first transistor, an N-type base of the PNP bipolar junction transistor, and an N-type collector of the NPN bipolar junction transistor are electrically connected, and
wherein the N-type semiconductor terminal of the second transistor and an N-type emitter of the NPN bipolar junction transistor are electrically connected to a pull-down node; and
an additional transistor comprising P-type semiconductor terminals, wherein the additional transistor is connected in series between the first transistor and the pull-down node.

10. The structure of claim 9, wherein the first transistor and the additional transistor comprise P-type field effect transistors and the second transistor comprises an N-type field effect transistor.

11. The structure of claim 9, wherein the first transistor and the additional transistor comprise P-type lateral double-diffused metal oxide semiconductor field effect transistors and the second transistor comprises an N-type lateral double-diffused metal oxide semiconductor field effect transistor.

12. The structure of claim 9, wherein the first transistor and the additional transistor comprise additional PNP bipolar junction transistors and the second transistor comprises an additional NPN bipolar junction transistor.

13. The structure of claim 9,
wherein the first transistor, the second transistor, and the additional transistor comprise corresponding control terminals connected to receive a reset signal, and
wherein the reset signal automatically switches between a first voltage in a first mode and a second voltage that is lower than the first voltage in a second mode.

14. The structure of claim 13, further comprising a power-on-reset connected to detect a power supply voltage, to output the reset signal at the first voltage when the power supply voltage is above a threshold level, and to output the reset signal at the second voltage when the power supply voltage is below the threshold level.

15. The structure of claim 9, further comprising: a semiconductor substrate having a top surface,
wherein the first transistor, the second transistor, the PNP bipolar junction transistor, the NPN bipolar junction transistor and the additional transistor are on the semiconductor substrate,
wherein the PNP bipolar junction transistor and the NPN bipolar junction transistor are connected to form a semiconductor controlled rectifier comprising:
a Pwell in the semiconductor substrate;
an Nwell in the semiconductor substrate positioned laterally adjacent to the Pwell;
a first P-type region in the Pwell at the top surface;
a first N-type region in the Pwell at the top surface;
a second P-type region in the Nwell at the top surface; and a second N-type region in the Pwell at the top surface,
wherein the first P-type region and the second P-type region have a higher P-type conductivity than the Pwell and wherein the first N-type region and the second N-type region have a higher N-type conductivity than the Nwell,
wherein the second P-type region, the Nwell and the first P-type region within the Pwell form a P-type emitter, the N-type base, and the P-type collector, respectively, of the PNP bipolar junction transistor, and
wherein the first N-type region, the Pwell and the second N-type region within the Nwell form the N-type emitter, the P-type base, and the N-type collector, respectively, of the NPN bipolar junction transistor.

16. A structure comprising:
a first transistor comprising a P-type semiconductor terminal and an additional P-type semiconductor terminal;
a second transistor comprising an N-type semiconductor terminal and an additional N-type semiconductor terminal;
a PNP bipolar junction transistor;
an NPN bipolar junction transistor,
wherein the P-type semiconductor terminal of the first transistor, a P-type collector of the PNP bipolar junction transistor, a P-type base of the NPN bipolar junction transistor, and the additional N-type semiconductor terminal of the second transistor are electrically connected,
wherein the additional P-type semiconductor terminal of the first transistor, an N-type base of the PNP bipolar junction transistor, and an N-type collector of the NPN bipolar junction transistor are electrically connected, and
wherein the N-type semiconductor terminal of the second transistor and an N-type emitter of the NPN bipolar junction transistor are electrically connected; and
a power-on-reset connected to control on/off states of the first transistor and the second transistor.

17. The structure of claim 16,
wherein the first transistor and the second transistor comprise corresponding control terminals connected to the power-on-reset,
wherein the power-on-reset is connected to detect a power supply voltage and to output a reset signal to the control terminals depending upon the power supply voltage,
wherein the reset signal is at a first voltage when the power supply voltage is above a threshold level so that the first transistor is in an off state and the second transistor is in an on state and at a second voltage that is lower than the first voltage when the power supply voltage is below the threshold level so that the first transistor is in the off state and the second transistor is in the off state.

18. The structure of claim 16, wherein the power-on-reset comprises:
a first node connected to a positive supply voltage rail;
a ground rail;
a second node connected to the ground rail;
a first resistor and a second resistor connected in series between the first node and the second node;
a third resistor connected between the first node and the second node; and
a comparator having an inverting input connected to a third node between the first resistor and the second resistor and a non-inverting input connected to a fourth node between the first node and the third resistor.

19. The structure of claim 18,
wherein the N-type semiconductor terminal of the second transistor and the N-type emitter of the NPN bipolar junction transistor are electrically connected at a pull-down node,
wherein the structure further comprises an additional transistor comprising P-type semiconductor terminals and a corresponding control terminal connected to the power-on-reset to receive a reset signal, and
wherein the additional transistor is connected in series between the first transistor and the pull-down node.

20. The structure of claim 16, wherein the first transistor and the second transistor comprise any of the following:
a P-type field effect transistor and an N-type field effect transistor;
a P-type lateral double-diffused metal oxide semiconductor field effect transistor and an N-type lateral double-diffused metal oxide semiconductor field effect transistor; and
an additional PNP bipolar junction transistor and an additional NPN bipolar junction transistor.

* * * * *